US008618812B2

(12) United States Patent
Casarsa (10) Patent No.: US 8,618,812 B2
(45) Date of Patent: Dec. 31, 2013

(54) ELECTRICAL INTERCONNECTION INTEGRATED DEVICE WITH FAULT DETECTING MODULE AND ELECTRONIC APPARATUS COMPRISING THE DEVICE

(75) Inventor: Marco Casarsa, Vaprio d'Adda (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 303 days.

(21) Appl. No.: 13/019,790

(22) Filed: Feb. 2, 2011

(65) Prior Publication Data

US 2011/0187384 A1    Aug. 4, 2011

(30) Foreign Application Priority Data

Feb. 2, 2010 (IT) .............................. MI2010A0151

(51) Int. Cl.
*G01R 31/04* (2006.01)
(52) U.S. Cl.
USPC ..................................... 324/538; 324/750.01
(58) Field of Classification Search
USPC .......................................................... 324/538
See application file for complete search history.

(56) References Cited

U.S. PATENT DOCUMENTS

| | | | | |
|---|---|---|---|---|
| 6,889,368 | B1 * | 5/2005 | Mark et al. ..................... | 714/732 |
| 7,516,237 | B2 * | 4/2009 | Booth et al. ................... | 709/232 |
| 2007/0257701 | A1 * | 11/2007 | Bancel et al. ................... | 326/38 |
| 2009/0113264 | A1 | 4/2009 | Seibold et al. ................ | 714/727 |
| 2009/0224794 | A1 | 9/2009 | Hyobu .......................... | 324/765 |

OTHER PUBLICATIONS

Chen et al., "A Novel BIST Approach for Testing Input/Output Buffers in SOCs," in *Proceedings of the 2009 IEEE Circuits and Systems International Conference on Testing and Diagnosis (ICTD '09)*, Institute of Electrical and Electronics Engineers (IEEE) and IEEE Circuits and Systems Society (CASS), Chengdu, China, Apr. 28-29, 2009, 3 pages.

* cited by examiner

*Primary Examiner* — Thomas F Valone
(74) *Attorney, Agent, or Firm* — Seed IP Law Group PLLC (57) ABSTRACT

An electrical interconnection integrated device is described, comprising: a plurality of electrical terminals connectable to an integrated electronic circuit on a chip common to said interconnection device; at least an inside electrical device provided with a respective input connected to a first terminal of said plurality and a respective output; a fault detecting logic module having a first input connected to said output of the inner electrical device and provided with a detecting terminal for supplying a fault detecting signal.

22 Claims, 5 Drawing Sheets

FIG. 5 though, that the Applicant observes that such trees of gates

ELECTRICAL INTERCONNECTION INTEGRATED DEVICE WITH FAULT DETECTING MODULE AND ELECTRONIC APPARATUS COMPRISING THE DEVICE

BACKGROUND

1. Technical Field

The present disclosure refers to electrical interconnection devices for integrated circuits in chip of semiconductor material, generally known as pads. Particularly, the present disclosure refers to techniques of locating faults of pads and integrated logic circuit which controls the inputs of pads.

2. Description of the Related Art

Figure 1:
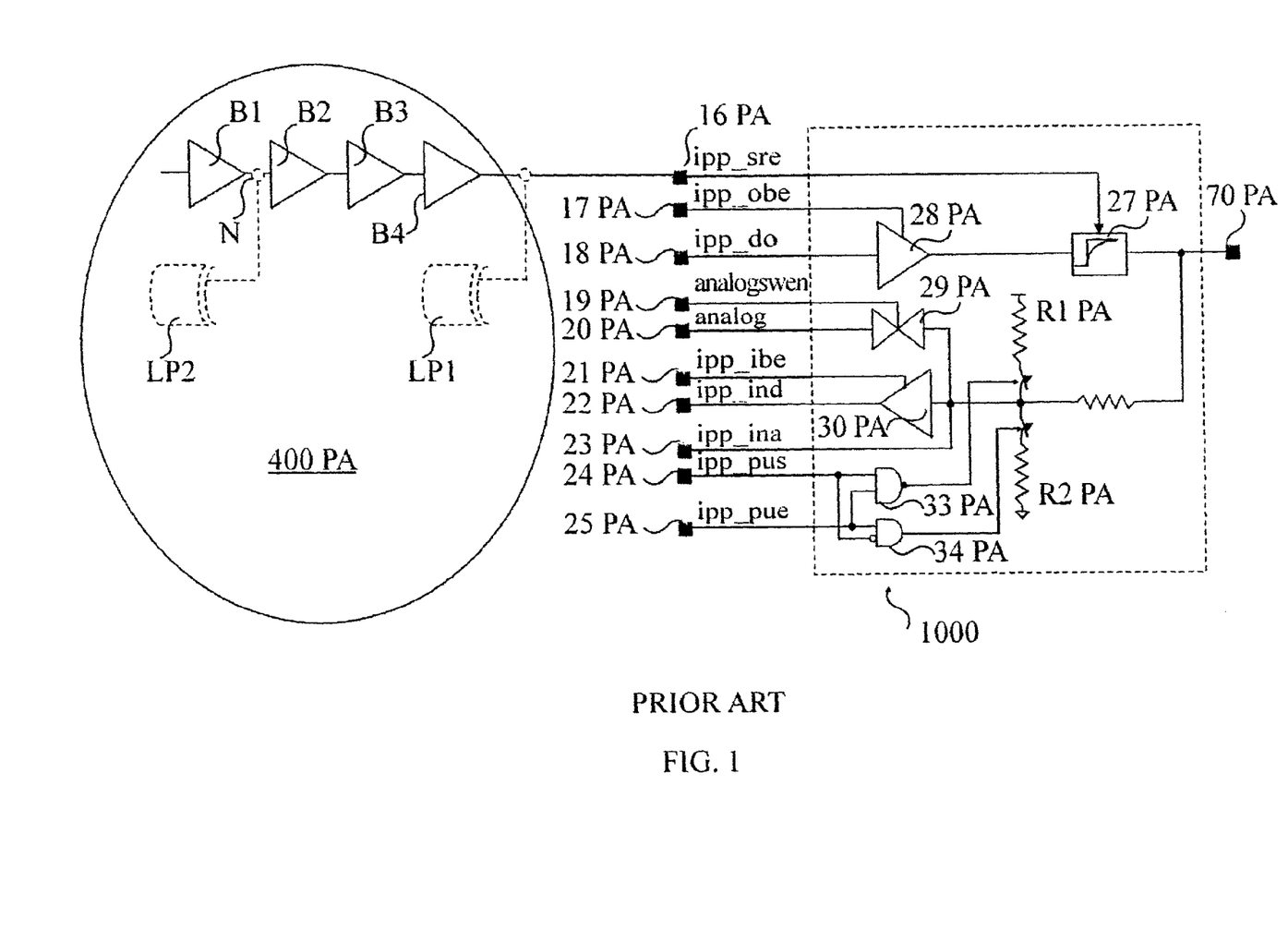
FIG. 1 schematically shows the structure of a pad according to the prior art provided with a test logic.

FIG. 1 schematically shows a pad 1000 of known type and comprising terminals or pins 16PA-25PA and an input-output terminal 70PA adapted to be connected, by a bonding wire, to a pin (not shown) of the integrated circuit package associated with the pad 1000 itself.

As shown in FIG. 1, pad 1000 is provided with buffers 28PA and 30PA, an analog switch 29PA and gates 33PA and 34PA. Moreover, pad 1000 is provided with a pull-up resistor R1PA and pull-down resistor R2PA enabling to adapt electrical currents and voltages which involve the pad 1000 to values predicted for the integrated circuit to which is connected the pad 1000 or to the electronic circuit outside the pad 1000.

Pins 16PA-25PA are connected to an integrated analog, digital, logic circuit 400PA which controls or monitors pins 16PA-25PA.

In the manufacturing of an integrated circuit, it is very important to detect faults (or defects) exhibited by the pad and the integrated logic circuit controlling the inputs of pads.

With reference to the faults of the pad and digital portion of the circuit 400PA, are known the EWS, Electrical Wafer Sort and Final Test tests. The EWS test is performed on a semiconductor wafer before connecting the pads to the pins of the package and, moreover, it is possible to predict that all the pins of the pad have not been tested. The Final Test evaluates the pad after a package has been applied to the corresponding integrated circuit. The tests are performed by providing to the pins corresponding to the digital signals (16PA-19PA, 22PA, 24PA, 25PA) specific patterns of signals which should allow to detect the faults by a signal at the pin 22PA and input-output terminal 70PA.

Moreover, for detecting the faults of the integrated logic circuit 400PA, it is known the use of trees of X-OR gates, connected to some of the digital pins 16PA-25PA. The output value of the tree of X-OR gates should reveal a defect of the logic circuit 400.

To this end, in FIG. 1, it is shown an X-OR gate, LP1 of such tree having an input directly connected to the pin 16PA which is electrically connected to the logic circuit 400PA by interposing decoupling buffers B1-B4. In this case, it is likely to detect also possible faults associated to the decoupling buffers B1-B4 by suitably monitoring the output of the tree of gates X-OR.

In another case, the tree of X-OR gates can comprise a gate LP2 having an input connected to the pin 16PA by decoupling buffers B2-B4. In this second case, it is not possible to detect also the possible faults associated to the decoupling buffers B2-B4 which follow the node N to which is connected the gate X-OR, LP2. The position of node N along the chain of buffers B1-B4 is not easily obtainable with precision during the layout step of the integrated circuit because, from a standpoint logic view, the operations of gates LP1 and LP2 are identical.

In any case, the Applicant observes that such trees of gates X-OR, used according to the prior art do not enable to detect the faults associated with a pad 1000.

According to a prevalent modeling of faults, a defect searched by the tests is of the kind of "stuck at" 0 or 1, due to this defect a given pin or point of the circuit of the pad is forcedly at a voltage value to which is associated the logic value 0 or 1, independently from its real operative condition.

Due to this possibility of detecting faults of circuits, it is known the use of providing a classification of faults well known by the person skilled in the art. For example, the term "detected for stuck at 0 or 1" means that there is always at least one pattern of input signals which enables to activate and propagate the fault so that the latter can be reliably detected at an exit pin. According to another example, the term "Undetectable" means that the fault can not be determined because it is not possible to detect a pattern of input signals enabling to activate and propagate the fault so that the latter can be reliably located at an exit pin.

BRIEF SUMMARY

The Applicant has observed that the known techniques of detecting faults can be improved because they do not guarantee a satisfying "coverage", that is, a detection of the faults.

One embodiment of the present disclosure is an interconnection device or pad which enables an improved coverage with respect to what it is possible to obtain with conventional techniques, without entailing an undue circuital complexity.

Some embodiments of the present disclosure include an interconnection device as defined in claim 1 and in the depending claims.

Some embodiments of the disclosure also include an electronic apparatus provided with a package as defined by claim 14 and by its depending claims.

BRIEF DESCRIPTION OF THE SEVERAL VIEWS OF THE DRAWINGS

Other characteristics and advantages of the disclosure will result from the following description of a preferred embodiment and of its variations provided as an example with reference to the attached drawings, wherein.

DETAILED DESCRIPTION

Figure 2:
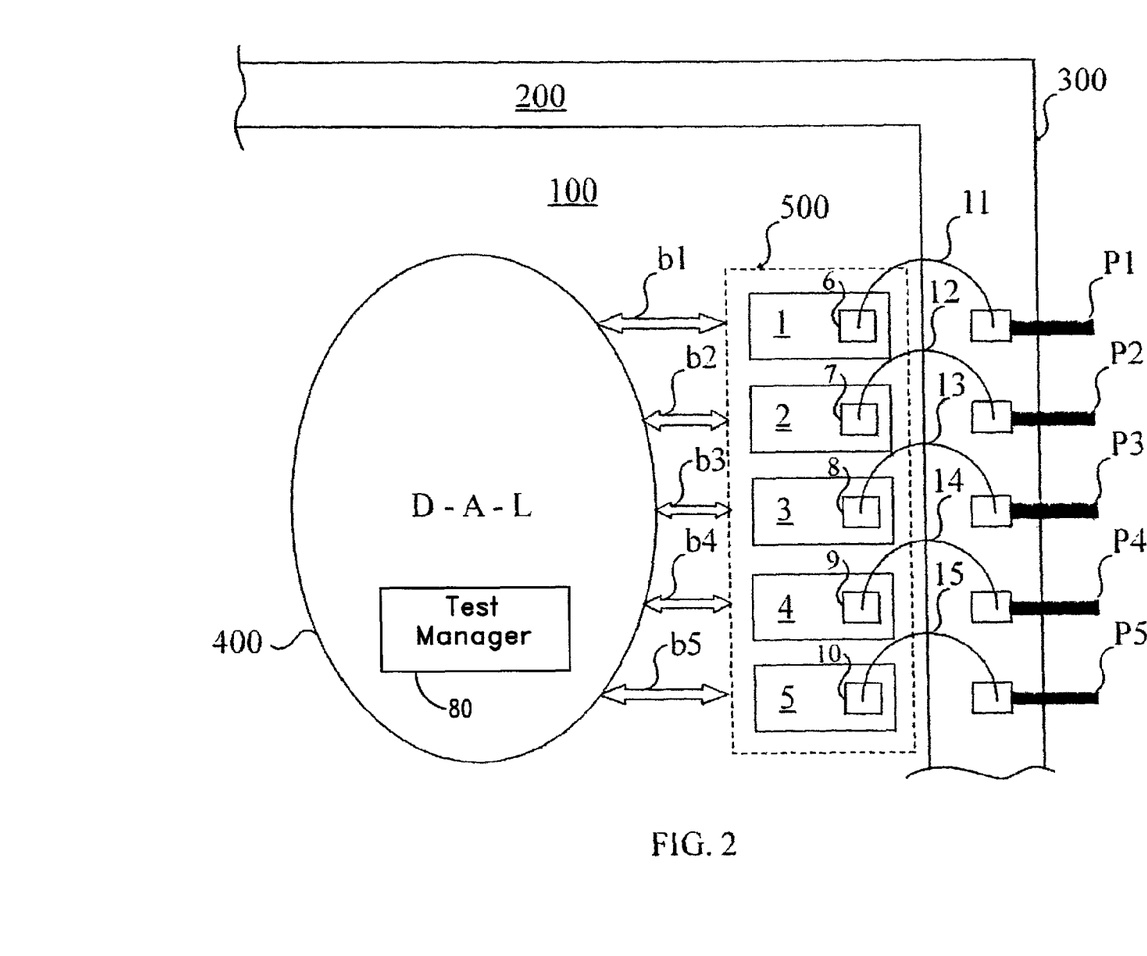
FIG. 2 schematically shows an electronic device provided with a plurality of pads and a package provided with pin according to a particular embodiment.

It is stated first, that in the present description and in the associated figures, components or signals shown in the figures with the same numerical or alpha-numerical references should be considered as identical or similar. FIG. 2 schematically illustrates an electronic apparatus 300, comprising an integrated circuit in a die of semiconductor material or chip 100, provided with a corresponding package 200. Chip 100 comprises a region in which it is made an integrated electronic circuit 400 such as, for example, a digital and analog logic D-A-L, and an electric interconnection region or pad region 500. The digital and analog logic 400 implements the functions associated with the electronic apparatus 300.

The pad region 500 comprises a plurality of pad devices (or electrical interconnection devices) 1-5 similar to each other.

Each pad device 1-5 is electrically connected to the digital and analog logic 400 by corresponding integrated conductive paths b1-b5 adapted to carry suitable signals. Moreover, each pad device 1-5 is provided with a corresponding bonding area 6-10 to which a corresponding conductive wire 11-15 is fixed which is connected, at the other end, to terminals or pins P1-P5 provided with corresponding bonding areas. Pins P1-P5 are adapted to receive signals outside the electronic apparatus 300 and transmit them to the outside and/or make available, outside the apparatus 300, the signals provided by the digital and analog logic 400.

The pad devices 1-5 act as an interface between the electronic apparatus 300 and the outer apparatuses to which this apparatus is connected, enabling also to perform a suitable decoupling of the corresponding inner devices and a suitable adaptation of the involved electrical voltages.

Figure 3:
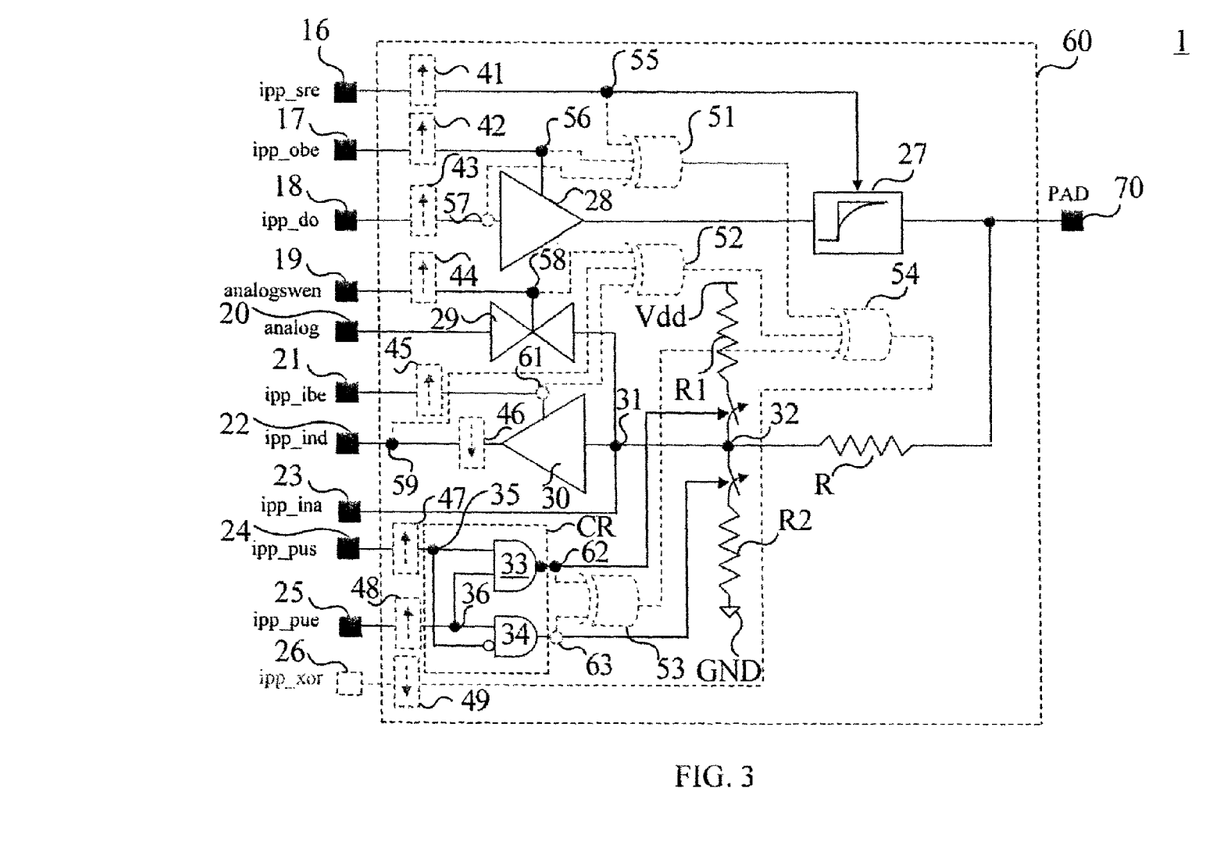
FIG. 3 schematically shows the structure of a pad according to a first embodiment.

An illustrative embodiment of the pad device 1 (in the following, briefly called, "pad 1") is shown in FIG. 3. The pad 1 comprises, for example, a plurality of electrical terminals or pins 16-26 connected to the integrated electronic circuit 400 of FIG. 2, an adapting block 60 and an input-output terminal 70. Pins 16-26 are connected to the integrated electronic circuit 400, for example, by conductive paths b1 of FIG. 2, while the input-output terminal 70 is connected to the bonding area 6.

The adapting block 60 moreover comprises, at least an inner electrical device and, particularly, can comprise a plurality of inner electrical devices. According to what has been illustratively shown in FIG. 3, possible examples of electrical devices inside the pad 1 are: an output buffer 28, a block 27 for controlling the transition rate, an analog transmission gate 29, an input buffer 30, a weak logic state driving device (for example comprising a pull-up resistor R1, a pull-down resistor R2 and a control device CR). Optionally, the adapting block 60 is provided with at least one voltage shifter 41. Eventually, there are other types of pads comprising further or different devices.

According to the example shown in FIG. 3, the first electrical terminal 16 is adapted to receive, from the integrated electronic circuit 400, a transition rate control digital signal ipp_sre (slew rate controller) capable of taking the logic value 0 or the logic value 1. The first electrical terminal 16 is connected to the transition rate control block 27 for supplying to the latter the transition rate control signal ipp_sre which adjusts its operation.

A second input terminal 17 is adapted to receive, from the integrated electronic circuit 400, an output buffer enable signal ipp_obe capable of taking the logic value 0 or 1. The second electrical terminal 17 is connected to the output buffer 28 (particularly, a tristate buffer) for supplying to the latter the buffer enable signal ipp_obe capable of enabling or disabling the operation of such buffer 28.

A third input terminal 18 is adapted to receive, from the integrated electronic circuit 400, a pad input digital signal 1 (Data Output) ipp_do associated with a datum to be made available at the input-output terminal 70. The third input terminal 18 is connected to an input of the output buffer 28, having a corresponding output connected to an input of the rate transition control block 27. An output of the rate transition control block 27 is connected to the input-output terminal 70.

Therefore, the input signal ipp_do can be suitably amplified by the output buffer 28 when active, then it can be supplied to the rate transition control block 27 which adjusts the rate of a ramp associated with the transitions from 0 to 1, and vice versa, of the input signal ipp_do.

The fourth terminal 19 is configured for receiving, from the integrated electronic circuit 400, a digital signal analogswen for enabling or disabling the transmission gate 29 which is provided with a first input/output connected to the fifth terminal 20 and a second input/output connected, by a resistor R, to the input-output terminal 70. According to the value taken by the enabling and disabling signal analogswen, the transmission gate 29 is enabled or disabled and, according to the voltage values present at the fifth terminal 20 and at the input-output terminal 70, there will be a different flow direction of the corresponding electrical current.

The fifth terminal 20 is configured to be put in connection, by the transmission gate 29 and the resistor R, with the input-output terminal 70 in order to take an electrical voltage dependent on the voltage taken at the input-output terminal 70 and therefore for transmitting or receiving an analog-type signal.

The sixth terminal 21 is configured for receiving, from the integrated electronic circuit 400, an input buffer enabling digital signal ipp_ibe adapted to selectively take logic values 0 and 1 in order to enable (for example, for the logic value 1) and disable the input buffer 30 (for example, for the logic value 0).

The seventh terminal 22 is connected to an exit of the input buffer 30 which is provided with an input connected to a node 31 in turn connected, by the resistor R, to the input-output terminal 70. The node 31 is also connected to the second input/output of the transmission gate 29.

When the input buffer 30 is enabled to operate, at the seventh terminal 22 is applied an output digital signal ipp_ind corresponding to the one present at the input-output terminal 70. When the input buffer 30 is disabled, the signal at the seventh terminal 22 takes a value independent of the input-output signal 70.

The eighth terminal 23 is configured for receiving from the input-output terminal 70, to which it is connected by the node 31 and resistor R, an input analog signal ipp_ina to be used for directly transmitting or receiving the analog signal present at the input-output terminal 70.

With reference to the weak logic state driving device, the pull-up resistor R1 is connected between a supplying terminal Vdd and a first node 32, interposed between the resistor R and node 31. The pull-down resistor R2 is connected between the ground terminal GND and the first node 32.

Each pull-up R1 and pull-down R2 resistors is implemented, for example, by one or more MOSFET (Metal Oxide Semiconductor Field Effect Transistor) transistors which can be activated or deactivated by corresponding drive signals from the control device CR. For example, the pull-up resistor R1 can be a P-channel MOSFET while the pull-down R2 can be a N-channel MOSFET.

According to the described example, the control device CR comprises a first NAND gate 33 and a second AND gate 34. The first NAND gate 33 is provided with a first input connected to a second node 35, in turn connected to a ninth terminal 24, and a second input connected to a third node 36. The ninth terminal 24 is configured for receiving a selection digital signal ipp_pus. An output of the first NAND gate 33 is connected to the pull-up resistor R1.

The second AND gate 34 is provided with a corresponding first inverting input connected to the second node 35 and a second input connected to the third node 36. The third node 36 is connected to the tenth terminal 25 which is configured for receiving a further enabling digital signal ipp_pue.

According to the shown example, when the enabling digital signal ipp_pue takes the value 0, no pull-up R1 and pull-down resistors R2 is enabled. When the enabling signal ipp_pue takes the value 1, according to the value taken by the selection signal ipp_pus, the pull-up resistor R1 is enabled (ipp_pus=1) or the pull-down resistor R2 is enabled (ipp_pus=0).

The first voltage translator 41 is connected between the first terminal 16 and the rate transition control block 27 and enables to suitably raise the electrical voltage associated with the rate transition control signal ipp_sre. According to a specified described example, the second 17, third 18, fourth 19, sixth 21, seventh 22, ninth 24, tenth 25 terminals are provided with a corresponding voltage translator 42-48 inside the adaptation block 60.

As it is known to the person skilled in the art of the level translators schematically shown in FIG. 3, symbol "↑" means that the corresponding level translator performs an increase of the electrical voltage between its input and its output while the symbol "↓" means that the corresponding level translator performs a decrease of the electrical voltage between its input and output.

It is to be noted that the teachings provided in this specification can be applied to pads of types different from those shown in the figures and specifically described and, that is, a pad which shows a different number of terminals or which is provided of inner devices different from those described (for example, with different electrical connections) or which do not have some of the described inner devices or which have additional ones.

The pad 1 is also provided with a fault detecting logic module 50 (FIG. 4) which, according to the example shown also in FIG. 3, comprises at least one input connected to an output of one of the electrical devices inside the adapting block 60 and that is inside the pad 1 itself. Advantageously, the fault detecting logic module 50 (FIG. 4) is integrated inside the pad 1.

Particularly, the fault detecting logic module 50 can be a combinatorial network comprising a plurality of gates. According to the example shown in FIGS. 3 and 4, the fault detecting logic module 50, which withdraws digital signals, comprises X-OR gates that is gates for which is provided an output of value 1 if the number of logic values 1 present at its inputs is odd.

The fault detecting logic module 50 can comprise other types of gates such as, for example, AND, NAND, NOT, OR, NOR gates, etc., combined in a different way from what is shown in the figures.

Figure 4:
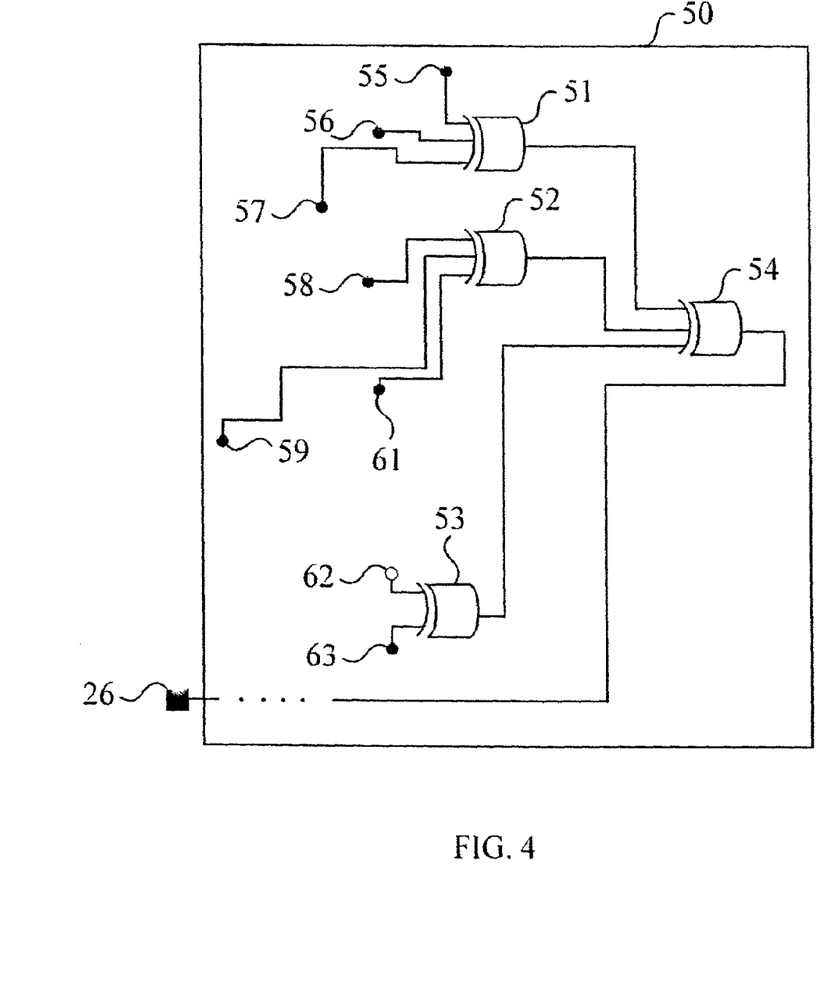
FIG. 4 shows the architecture of an example of a module for detecting faults employable in the pad of FIG. 3.

More particularly, the fault detecting logic module 50 is provided with a first X-OR gate 51, second X-OR gate 52, third X-OR gate 53 and a fourth X-OR gate 54.

The first gate 51 is provided with a first input 55 connected at the output of the first voltage translator 41 associated with the first terminal 16, a second input 56 connected at the output of a second voltage translator 42 associated with the second terminal 17, a third input 57 connected at the output of a third voltage translator 43 and associated with the third terminal 18. The output of the first gate 51 leads to an input of the fourth gate 54.

The second gate 52 is provided with: a fourth input 58 connected to the output of a fourth level translator 44 associated with the fourth terminal 19, a fifth input 59 connected at the output of a sixth level translator 46 and associated with a seventh terminal 22, and a sixth input 61 connected at the output of a fifth level translator 45 associated with the sixth terminal 21. The output of the second gate 52 leads to a further input of the fourth gate 54.

The third gate 53 is provided of: a seventh input 62 connected at the output of the first NAND gate 33, an eight input 63 connected at the output of the second AND gate 34. The output of the third gate 53 leads to a further input of the fourth gate 54.

The fourth gate 54 combines the signals at its inputs and is provided with an output connected, by a ninth level translator 49, (only shown in FIG. 3 and performing a downward translation) to the detecting terminal 26, adapted to supply a detecting signal ipp_xor indicative of the result of a test performed at the pad 1.

Referring also to FIG. 2 with reference to the electronic apparatus 300, the digital and analog logic 400 (D-A-L) is provided with a test managing block 80 addressing, among other things, the managing of the detecting signal ipp_xor for monitoring the logic state, for example, by an acquisition flip-flop.

The fault detecting module 50, which is integrated inside the pad 1, can be used for detecting the presence of a fault in the pad 1 and also the presence of faults of a digital part of the digital and analog logic 400. The possibility of detecting both faults of a digital portion of the digital and analog logic 400 and faults inside the pad 1 is particularly advantageous with reference to the approach of the prior art shown in FIG. 1, according to it the X-OR tree can be used only for detecting the faults associated with the control logic 400PA outside of the pad 1000.

Moreover, the detecting module 50, can be used also for diagnostic operations of the pad having the purpose of detecting specific terminals on which the faults are present.

The pad of FIG. 3 can be implemented by conventional techniques of integration of electronic circuits in chip of semiconductor material. Particularly, the pad of FIG. 3, in comparison with the digital and analog logic 400 (particularly its digital portion) is a so-called hard block, that is, it is designed one time and used as is without being modified. The pad 1 and, particularly, each terminals 16-25, there can have different kinds of faults which compromise the correct operation. For example, according to a known technique of modeling of faults, can be present the so-called stuck-at faults causing the digital terminals of the plurality 16-25 or other points of pad 1 to behave as if they had a fixed voltage value independently of the forced value that should be predicted for their correct operation.

The faults can be found by different test steps to be performed by the pad 1. Some of such conventional test steps are: the EWS (Electrical Wafer Sort) and Final Test. The EWS test operates on all or some of pads 1-5 without the bonding connection to the pins P1-P5 of the package 200. The Final Test operates on all or some of the pads provided of the relative bonding connection to the pins P1-P5.

In case of the Final Test, for performing the test steps it is used a test machine (not shown and known per se) that is connected to the pins P1-P5 of the electronic apparatus 300 of FIG. 2 and that suitably configures both the digital and analog logic 400 and the test managing block 80. Instead, in the case of EWS test, the test machine is connected to the bonding areas 6-10.

The tests are performed by applying to the terminals 16-25 and input-output terminal 70 a combination of signals and reading the corresponding result at the detecting terminal 26 by the test managing block 80. The managing block 80 signals the fault to the test machine directly by a pad dedicated to this operation or by a "scan structure". As it is known to the person skilled in the art, the scan structure is an architecture comprised in the digital and analog logic 400 which causes the logic 400 to be configured as a shift register and is used by the tool ATGP for generating test patterns. The test patterns can be obtained by using tools enabling the automatic generation of inspecting patterns commonly indicated by the acronym ATPG (Automatic Test Pattern Generation).

It is possible to classify the faults with reference to the possibility or probability that they are detected. In the following, the definitions regarding the classification of faults, used in the present specification, are given.

A fault is classified as "detected" when it is possible to apply a pattern to which corresponds at least an exit signal examinable, without uncertainties, of the circuit undergoing the test which is different from the one obtainable by applying the same pattern to a circuit free of faults and used as a reference.

A fault is classified as "Undetectable by ATPG" when the ATPG test is not capable of detecting the fault.

A fault is classified as "Parametric detected" when can be detected only by a parametric measurement of the concerned electrical quantities, such as electrical voltages or currents different from the conventional logic states 0 and 1 at the input-output terminal 70.

A fault is classified as "Possible detected" when it is possible to apply a pattern to which corresponds at least an observable output signal, but with uncertainties, of the circuit undergoing the test which is different from the one obtainable by applying the same pattern to a circuit free of faults and used as reference. The detection of this fault is possible but non-deterministic and can be detected with a probability of 50%.

A fault is defined as "detected rely on pull drivers" when the certainty is less than the "detected" classification because there is a dependence on the voltage values due to the pull-up and pull-down resistors, R1 and R2, which make less certain the distinction between the detected values.

With reference to the stuck-at 0/1 faults, the fault classification with reference to each terminal of the group 16-19, 21-22 and 24-25 affected by digital signals, depends on both the circuitry connected to the terminal itself and the type of connection of the fault detecting module 50 integrated in the pad 1.

In the following Table 1, it is shown the classification of faults of the pad 1 for the digital terminals 16-19 and 21, 22, 24, 25 and of the input-output terminal 70 of FIG. 1.

TABLE 1

(FIGS. 3 and 4)

| Terminal No. | Bounded stuck at 0/1<br>Unbounded stuck at 0/1 |
|---|---|
| 16 | Detected |
| 17 | Detected |
| 18 | Detected |
| 19 | Detected |
| 21 | Detected |
| 22 | Detected |
| 24 | Detected |
| 25 | Detected |
| 70 | Bounded stuck at 0/1: detected<br>Unbounded stuck at 0/1: undetectable by ATPG |

In the following it is reported Table 2 in which the faults classifications are indicated for a pad circuit 1000 according to the prior art, shown in FIG. 1, and evaluated according to the methodology ATPG.

TABLE 2

(prior art, FIG. 1)

| Terminal | Bounded stuck at 0/1<br>Unbounded stuck at 0/1 |
|---|---|
| 16PA | Undetectable by ATPG |
| 17PA | detected rely on pull drivers or possible detected |
| 18PA | detected |
| 19PA | undetectable by APTG |
| 21PA | detected |
| 22PA | detected |
| 24PA | Detected rely on pull drivers or possible detected |
| 25PA | Bounded stuck at 0/1: parametric detected<br>Unbounded stuck at 0/1: possible detected |
| 70PA | Bounded stuck at 0/1: detected<br>Unbounded stuck at 0/1: undetectable by ATPG |

Comparing Table 1 with Table 2, the above described classification, with reference to the faults of pad 1 comprising the faults detecting module 50, is better in terms of the "coverage", that is, the possibility of detecting the fault with respect to the pad implemented according to the prior art and using a methodology such as, according to a non-limitative example, the ATPG.

An improvement of the coverage can be obtained for the first 16, second 17, fourth 19 and ninth 24 and tenth terminals 25.

It is to be noted that the provision of the detecting terminal 26, connected by its output to the fault detecting module 50, appears an advantageous approach because its use does not entail the introduction of propagation delays at pad 1.

For example, one should consider the prior art pad 1000 in FIG. 1 and should refer to the enabling digital signal ipp_pue. When such enabling signal ipp_pue is at value 1, it enables the pull-up resistor R1PA or pull-down resistor R2PA as a function of the value of the selection digital signal ipp_pue (1→pull-up and 0→pull-down). For detecting the presence of a "stuck-at 0" fault at pin ipp_pue, the terminal 25PA (terminal corresponding to the enabling signal ipp_pue) is forced to value 1, that is the value opposed to that of the stuck-at fault, suitably configuring the digital and analog logic 400, for example, by the above described scan structure.

Assuming the selection digital signal ipp_pus equals 1, in case the stuck-at fault is absent, the pull-up resistor R1PA is activated. For identifying a possible fault due to the stuck at to 0, the buffer enabling signal ipp_obe is forced to 0. Without faults, the output buffer 28PA is turned off, the outer driver applied to the input-output terminal 70PA has a high impedance so the output-input terminal 70PA takes a voltage value Vdd (equivalent to a logic state 1) due to the turning on of the pull-up resistor R1PA.

If a fault is present, there will be a high impedance value at the input-output terminal 70PA, that is, a non-deterministic value, because the output buffer 28PA is turned off. In fact, the pull-up resistor R1PA, due to the fault, is not activated and therefore it will not force any voltage leaving the node 31 in a high impedance state.

For monitoring the fault in the pad of FIG. 1, it is provided the propagation of the signal present at the input-output terminal 70PA to the inner circuitry, by enabling the signal ipp_ind through the pin ipp_ibe. Without faults, at the terminal of the signal ipp_ind, there will be propagated value 1 (that is the propagation of Vdd). With the presence of "stuck-at 0" fault at pin 25PA (with reference to signal ipp_pue), at the terminal of signal ipp_ind it is found again an unpredictable value, indicated in the sector by X (or U that is undefined), which is equivalent to the propagation of the high impedance present at the input-output terminal 70PA.

In this case, the fault can be considered Possible Detected because in case wherein X (which is not a physical value, but a logic state used during the modeling) equals 0, the fault is detected (it was expected 1 from a circuit free of fault) while in case wherein equals 1, the fault is considered undetected. It should be mentioned that, as a convention, a fault is defined as Possible Detected if it has a probability to be detected of 50%.

Considering instead the pad 1 of FIG. 3, for the tenth terminal 25, the fault is classified as detected thanks to the presence of the fault detecting module 50 which is used for detecting the faults of the pad 1 itself Particularly, at the third gate 53 which is connected to the output of gates 33 and 34. A fault of the tenth terminal 25 or one of these gates 33 and 34, is highlighted by the value taken by the detecting signal ipp_xor present at the detecting terminal 26 and is observed by the test block 80.

Moreover it is clear, from what has been herein described, that the fault detecting module 50, due to the fact its inputs are directly connected to the output of specific devices inside the pad 1, will take to a detecting signal ipp_xor present at the detecting terminal 26 which will be also influenced by the behavior of the inner devices, providing therefore a more complete coverage of the faults.

Moreover, the fault detecting module 50 enables to detect, not only the stuck-at faults but also the transient faults, bound to the presence of delays introduced, for example, by some level translators 41-49. In fact, the present of inputs of the gates of the fault detecting module 50 downstream a level translator enables to evaluate the presence of an undesired delay caused by it.

Figure 5:
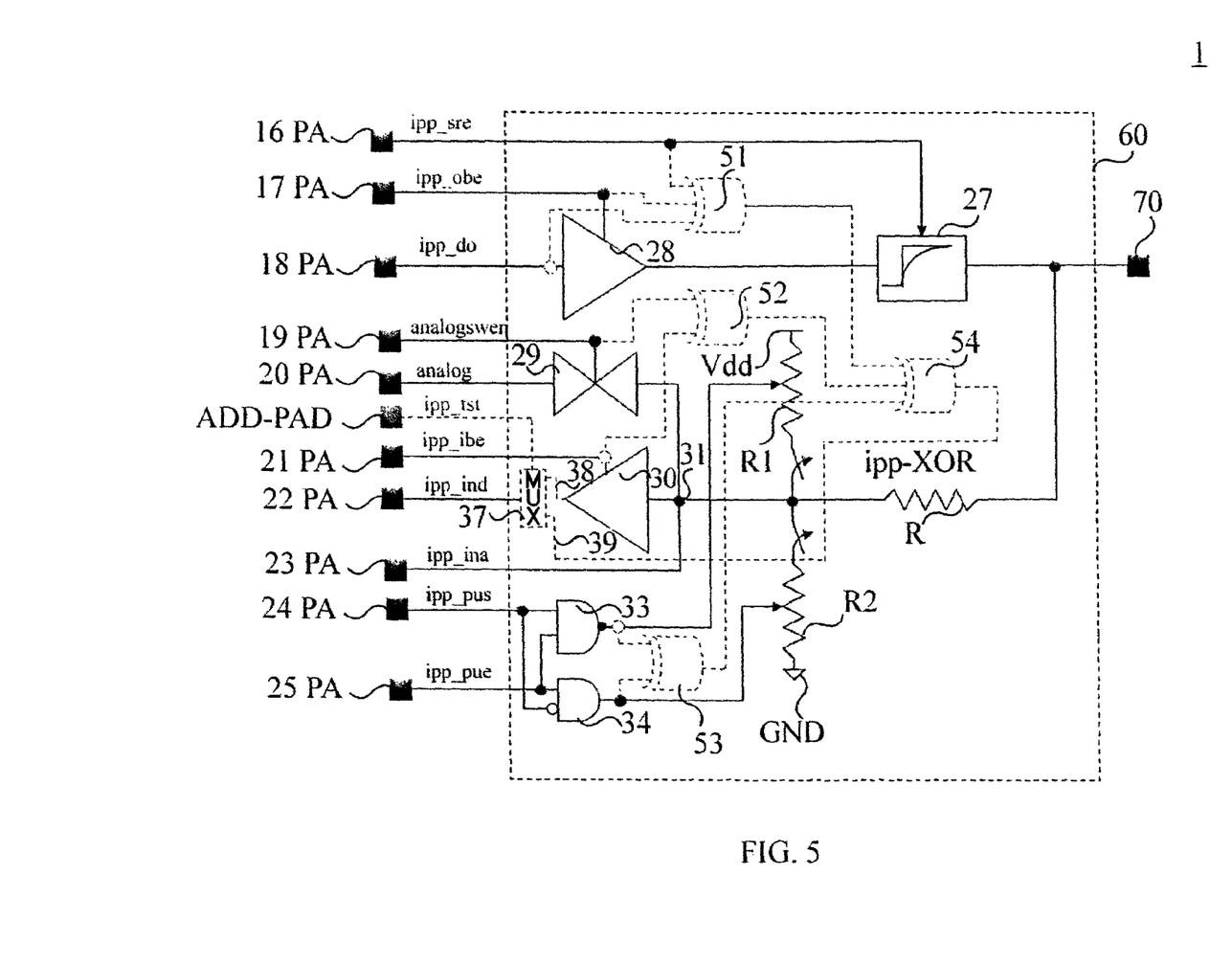
FIG. 5 schematically shows the structure of a pad according to a second embodiment.

In FIG. 5, it is shown a further embodiment of the pad 1, used in the electronic apparatus 300 of FIG. 2, similar to that of the pad 1 shown in FIG. 3. According to this further embodiment, a multiplexer 37 having a corresponding first input 38 connected to the output of the output buffer 30 and a corresponding second input 39 for receiving the output of the fourth gate 54 of the fault detecting module 50 is used. An output of the multiplexer 37 is connected to the seventh terminal 22 and the multiplexer 37 is provided with an input for a selection digital signal ipp_tst to be supplied by the integrated electronic circuit 400 to a selection terminal ADD-PAD.

According to the logic value taken by the selection digital signal ipp_tst, the multiplexer 37 will supply to the seventh terminal 22 the input digital signal ipp_ind from the output buffer 30 or the detecting signal ipp_xor from the fourth gate 54. Referring to FIG. 5, the same Table 1 corresponding to the classification of faults referring to the pad itself is also valid.

During the normal operation of the pad 1 of FIG. 5, the value of the test selection digital signal ipp_tst is forced so that it assumes a logic value which enables the propagation of the signal present at the first input 38, while during the test pattern generation by, for example, ATPG and the following activation of the scan structure, such signal ipp_tst can take selectively both the logic values.

For simplifying the representation, in FIG. 5 the level translators are not shown, which anyway can be possibly present at some or all terminal 16-19, 21-22 and 24-25.

The embodiment shown in FIG. 5 is advantageous because its design is not complex and moreover it does not need the test managing block 80 to have a complex design because it is not necessary to monitor the signal exiting the fault detecting module 50. Instead, the test managing block 80 is capable of controlling the multiplexer 37, for example, by generating suitable values of the selection digital signal test ipp_tst.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An integrated electrical interconnection device comprising:
   a plurality of electric terminals integrated on a pad area of a semiconductor chip and configured to be coupled to an integrated electronic circuit on the chip shared with said interconnection device;
   an input/output terminal integrated on the pad area of the semiconductor chip and configured to be electrically coupled to an external electronic device off of the chip;
   an adapter circuit integrated on the pad area of the semiconductor chip and configured to electrically couple the plurality of electric terminals to the input/output terminal, the adapter circuit including an inner electric device having a corresponding input coupled to a first terminal of said plurality and a corresponding output, the inner electric device being configured to provide a digital signal at the output; and
   a fault detecting logic module integrated on the pad area of the semiconductor chip and having a first input coupled to said output of the inner electric device and having a detecting terminal, the fault detecting logic module being configured to receive the digital signal, detect whether a fault exists on the interconnection device, and output from the detecting terminal a fault detecting signal representing whether the fault exists on the interconnection device.

2. An interconnection device according to claim 1, wherein the fault detecting logic module comprises a combinatorial network.

3. An interconnection device according to claim 2, wherein the fault detecting logic module comprises a plurality of gates including an output gate configured to output the fault detecting signal.

4. An interconnection device according to claim 3, wherein said plurality of gates comprises a plurality of X-OR gates.

5. An interconnection device according to claim 1, wherein the fault detecting module is configured to detect stuck-at faults of the interconnection device.

6. An interconnection device according to claim 5, wherein said inner electric device comprises:
   a logic state driving device associated with said input/output terminal; and
   a control module provided with an input terminal, coupled to a second terminal of said plurality of electric terminals that is configured to receive an enabling signal of the driving device, and an output terminal coupled to said driving device and said fault detecting module, the control module being configured to control the driving device.

7. An interconnection device according to claim 5, further comprising
   an output buffer having a respective input coupled to a second terminal of said plurality and to a second input of the fault detecting module, the output buffer being configured to provide an output signal; and a transition rate control device having a driving input connected to a third input of the fault detecting module and an output coupled to said input/output terminal, the transition rate control device being configured to control a transition rate of the output signal of said output buffer.

8. An interconnection device according to claim 5, further comprising:
a resistor; and
an input buffer having a data input, coupled to said input/output terminal by the resistor, and a data output coupled to a third terminal of said plurality, the fault detecting module being provided with a fourth input connected to the third terminal of said plurality.

9. An interconnection device according to claim 8, further comprising a multiplexer having:
a first input port coupled to the data output of said input buffer;
a second input port coupled to the detecting terminal and configured to receive the fault detecting signal;
an output port coupled to the third terminal of said plurality; and
a selecting input configured to receive a test selecting signal, the multiplexer being configured to selectively couple the output port to the first and second input ports.

10. An interconnection device according to claim 1, wherein said inner electric device comprises a voltage translator.

11. An interconnection device according to claim 1, wherein the fault detecting module is configured to detect faults in digital value configurations supplied to said plurality of electric terminals.

12. An interconnection device according to claim 1, wherein the fault detecting module is arranged to be used in a test step of the interconnection device.

13. An electronic apparatus, comprising:
an integrated electronic circuit on a die of semiconductor material;
an electric interconnection device integrated on a pad area of the die of semiconductor material; and
a package configured to cover the integrated electronic circuit and the electric interconnection device;
wherein said electric interconnection device includes:
a plurality of electric terminals integrated on the pad area of the die and coupled to the integrated electronic circuit;
an input/output terminal configured to be electrically coupled to an external electronic device off of the die;
an adapter circuit configured to electrically couple the plurality of electric terminals to the input/output terminal, the adapter circuit including an inner electric device having a corresponding input coupled to a first terminal of said plurality and a corresponding output, the inner electric device being configured to provide a digital signal at the output; and
a fault detecting logic module having a first input coupled to said output of the inner electric device and provided with a detecting terminal, the fault detecting logic module being configured to receive the digital signal, detect whether a fault exists on the interconnection device, and output from the detecting terminal a fault detecting signal representing whether the fault exists on the interconnection device.

14. An electronic apparatus according to claim 13, wherein the integrated electronic circuit includes a test circuit block configured to manage said detecting signal.

15. An electronic apparatus according to claim 13, wherein the interconnection device comprises:

a resistor;
an input buffer having a data input, coupled to said input/output terminal by the resistor, and a data output coupled to a third terminal of said plurality, the fault detecting module being provided with a fourth input connected to the third terminal of said plurality; and
a multiplexer having:
a first input port coupled to the data output of said input buffer;
a second input port coupled to the detecting terminal and configured to receive the fault detecting signal;
an output port coupled to the third terminal of said plurality; and
a selecting input configured to receive a test selecting signal, the multiplexer being configured to selectively couple the output port to the first and second input ports.

16. An electronic apparatus according to claim 15, wherein said integrated electronic circuit comprises a test circuit block configured to control said multiplexer.

17. An electronic apparatus according to claim 13, wherein said fault detecting module is configured to detect faults of the integrated electronic circuit.

18. An electronic apparatus, comprising:
an integrated electronic circuit integrated on a pad area of the die of semiconductor material; and
an interconnection pad integrated on a pad area of the die of semiconductor material, wherein said electric interconnection pad includes:
a plurality of electric terminals integrated on the pad area of the die and configured to be coupled to the integrated electronic circuit;
an input/output terminal configured to be electrically coupled to an external electronic device off of the chip;
an adapter circuit configured to electrically couple the plurality of electric terminals to the input/output terminal, the adapter circuit including an inner electric device having a corresponding input coupled to a first terminal of said plurality and a corresponding output, the inner electric device being configured to provide a digital signal at the output; and
a fault detecting logic module having a first input coupled to said output of the inner electric device and provided with a detecting terminal, the fault detecting logic module being configured to detect a fault in the inner electric device and output from the detecting terminal a fault detecting signal representing whether the fault exists on the interconnection device.

19. An electronic apparatus according to claim 18, wherein the integrated electronic circuit includes a test circuit block configured to manage said detecting signal.

20. An electronic apparatus according to claim 18, wherein the interconnection device comprises:
an input buffer having a data input, coupled to said input/output terminal, and a data output coupled to a third terminal of said plurality, the fault detecting module being provided with a fourth input connected to the third terminal of said plurality; and
a multiplexer having:
a first input port coupled to the data output of said input buffer;
a second input port coupled to the detecting terminal and configured to receive the fault detecting signal;
an output port coupled to the third terminal of said plurality; and a selecting input configured to receive a test selecting signal, the multiplexer being configured to selectively couple the output port to the first and second input ports.

21. An electronic apparatus according to claim 20, wherein said integrated electronic circuit comprises a test circuit block configured to control said multiplexer.

22. An electronic apparatus according to claim 18, wherein said fault detecting module is configured to detect faults of the integrated electronic circuit.

* * * * *